United States Patent
Chiu et al.

(10) Patent No.: US 12,081,208 B2
(45) Date of Patent: Sep. 3, 2024

(54) HIGH POWER MULTIPLE FREQUENCY COUPLING GENERATOR AND DRIVING METHOD THEREOF

(71) Applicant: INDUSTRIAL TECHNOLOGY RESEARCH INSTITUTE, Hsinchu (TW)

(72) Inventors: Chih-Chung Chiu, Miaoli (TW);
Hung-Yi Teng, Kaohsiung (TW);
Chi-Chung Liao, Tainan (TW);
Shou-Chung Hsieh, Tainan (TW);
Ke-Horng Chen, Hsinchu (TW);
Yan-Fu Jhou, Tainan (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 11 days.

(21) Appl. No.: 18/128,916

(22) Filed: Mar. 30, 2023

(65) Prior Publication Data
US 2024/0080024 A1   Mar. 7, 2024

(51) Int. Cl.
*H03K 17/56* (2006.01)

(52) U.S. Cl.
CPC .................................. *H03K 17/56* (2013.01)

(58) Field of Classification Search
CPC .................................. H03K 17/56; H04B 1/00
See application file for complete search history.

(56) References Cited

U.S. PATENT DOCUMENTS

| 5,877,419 A | 3/1999 | Farokhzad |
| 6,563,211 B2 | 5/2003 | Fukada et al. |
| 6,975,261 B1 | 12/2005 | Isham |

(Continued)

FOREIGN PATENT DOCUMENTS

| CN | 202068386 U | 12/2011 |
| CN | 105335602 A | 2/2016 |

(Continued)

OTHER PUBLICATIONS

Banaei et al., "Asymmetric Cascaded Multi-level Inverter: A Solution to Obtain High Number of Voltage Levels", J. Electr. Eng. Technol., vol. 8, No. 2: pp. 316-325, 2013.

(Continued)

*Primary Examiner* — Quan Tra
(74) *Attorney, Agent, or Firm* — Birch, Stewart, Kolasch & Birch, LLP

(57) ABSTRACT

A driving method for a multiple frequency coupling generator is provided. The method includes: in normal operations, interpreting an input digital control signal transmitted from a digital signal processor into an interpreted digital control signal; interpreting the interpreted digital control signal into a plurality of magnetic coupling signals by a magnetic coupling switch circuit; performing signal recovery and differential delay on the magnetic coupling signals by an interlocking circuit for reducing time difference and signal loss of the magnetic coupling signals; and when the interlocking circuit determines that the magnetic coupling signals have substantially no time difference and no signal loss, transforming the magnetic coupling signals into a first driving signal and a second driving signal by a switch circuit, a driver circuit and an output pad group to drive a backend driving loop.

12 Claims, 7 Drawing Sheets

(56) References Cited

U.S. PATENT DOCUMENTS

| | | |
|---|---|---|
| 7,612,469 B2 | 11/2009 | Kuo |
| 8,004,304 B2 | 8/2011 | Tametani et al. |
| 8,027,132 B2 | 9/2011 | Omaru |
| 10,141,872 B2 | 11/2018 | Cash |
| 10,288,696 B2 | 5/2019 | Chiu et al. |
| 10,601,417 B2 | 3/2020 | Watanabe et al. |
| 11,038,507 B2 | 6/2021 | Lin |
| 2015/0109033 A1* | 4/2015 | Zajc .................. H03K 17/302 327/133 |
| 2018/0334046 A1 | 11/2018 | Lee et al. |
| 2019/0334521 A1* | 10/2019 | Takamori .............. H02M 1/08 |
| 2021/0208560 A1 | 7/2021 | Maier |
| 2023/0308083 A1* | 9/2023 | Reiter .................. H03K 17/51 |

FOREIGN PATENT DOCUMENTS

| | | |
|---|---|---|
| CN | 208939811 U | 6/2019 |
| CN | 108473156 B | 5/2020 |
| CN | 112701990 A | 4/2021 |
| TW | I598608 B | 9/2017 |
| TW | 201946357 A | 12/2019 |
| TW | I718781 B | 2/2021 |
| TW | 202201894 A | 1/2022 |
| WO | WO 2014/056393 A1 | 4/2014 |

OTHER PUBLICATIONS

Mecke, "Multilevel Inverter with New Wide-Bandgap SiC and GaN Power Switches", 2021 IEEE 15th International Conference on Compatibility, Power Electronics and Power Engineering, total of 6 pages.

Panda et al., "Research on cascade multilevel inverter with single DC source by using three-phase transformers", Electrical Power and Energy Systems 40 (2012), pp. 9-20.

* cited by examiner

HIGH POWER MULTIPLE FREQUENCY COUPLING GENERATOR AND DRIVING METHOD THEREOF

This application claims the benefit of Taiwan application Serial No. 111133411, filed Sep. 2, 2022, the disclosure of which is incorporated by reference herein in its entirety.

TECHNICAL FIELD

The disclosure relates in general to a high power multiple frequency coupling generator and a driving method thereof.

BACKGROUND

Along with the increase in the degree of electrification of vehicle devices, the duties expected of an electronic control system are getting more complicated. High efficiency, stability and improvements of integrative vehicle performance are important duties expected of an electronic control system.

Since the system operates in a severe environment and is crucial to the operation of the drive control system, unexpected loss will occur if the electronic control system suddenly fail due to unexpected external factors (such as magnetic induction/surge).

The present disclosure provides a high power multiple frequency coupling generator, which controls magnetic frequency band with a smart data coupling control mechanism. With a smart adjustment mechanism, the driver is not subjected to magnetic interference when sending instructions or transmitting information.

SUMMARY

According to one embodiment, a multiple frequency coupling generator coupled to a digital signal processor is provided. The multiple frequency coupling generator includes an interpretation channel, a magnetic coupling switch circuit, an interlocking circuit, a switch circuit, a driver circuit, and an output pad group. The interpretation channel is coupled to the digital signal processor for signal transmission between the interpretation channel and the digital signal processor, wherein the interpretation channel interprets an input digital control signal transmitted from the digital signal processor into an interpreted digital control signal. The magnetic coupling switch circuit is coupled to the interpretation channel to receive the interpreted digital control signal from the interpretation channel, wherein the magnetic coupling switch circuit includes a three-phase channel, and, through interpretation, generates a plurality of magnetic coupling signals each having a signal width parameter and a signal potential parameter. The interlocking circuit is coupled to the switch circuit to receive the magnetic coupling signals, wherein the interlocking circuit performs phased coupling on the magnetic coupling signals and an output signal of the interlocking circuit. The switch circuit is coupled to the interlocking circuit to receive the output signal of the interlocking circuit, wherein the switch circuit performs band switching on the output signal of the interlocking circuit to generate an output signal. The driver circuit is coupled to the switch circuit to generate a first driving signal and a second driving signal according to the output signal of the switch circuit. The output pad group is coupled to the driver circuit to transmit the first and the second driving signals of the driver circuit to a backend driving loop.

According to another embodiment, a driving method for a multiple frequency coupling generator is provided. The driving method is used on the said multiple frequency coupling generator and includes: in normal operations, interpreting an input digital control signal transmitted from a digital signal processor into an interpreted digital control signal; interpreting the interpreted digital control signal into a plurality of magnetic coupling signals by a magnetic coupling switch circuit; performing signal recovery and differential delay on the magnetic coupling signals by an interlocking circuit for reducing time difference and signal loss of the magnetic coupling signals; and when the interlocking circuit determines that the magnetic coupling signals have substantially no time difference and no signal loss, transforming the magnetic coupling signals into a first driving signal and a second driving signal by a switch circuit, a driver circuit and an output pad group to drive a backend driving loop.

The above and other aspects of the invention will become better understood with regard to the following detailed description of the preferred but non-limiting embodiment(s). The following description is made with reference to the accompanying drawings.

Figure 1:
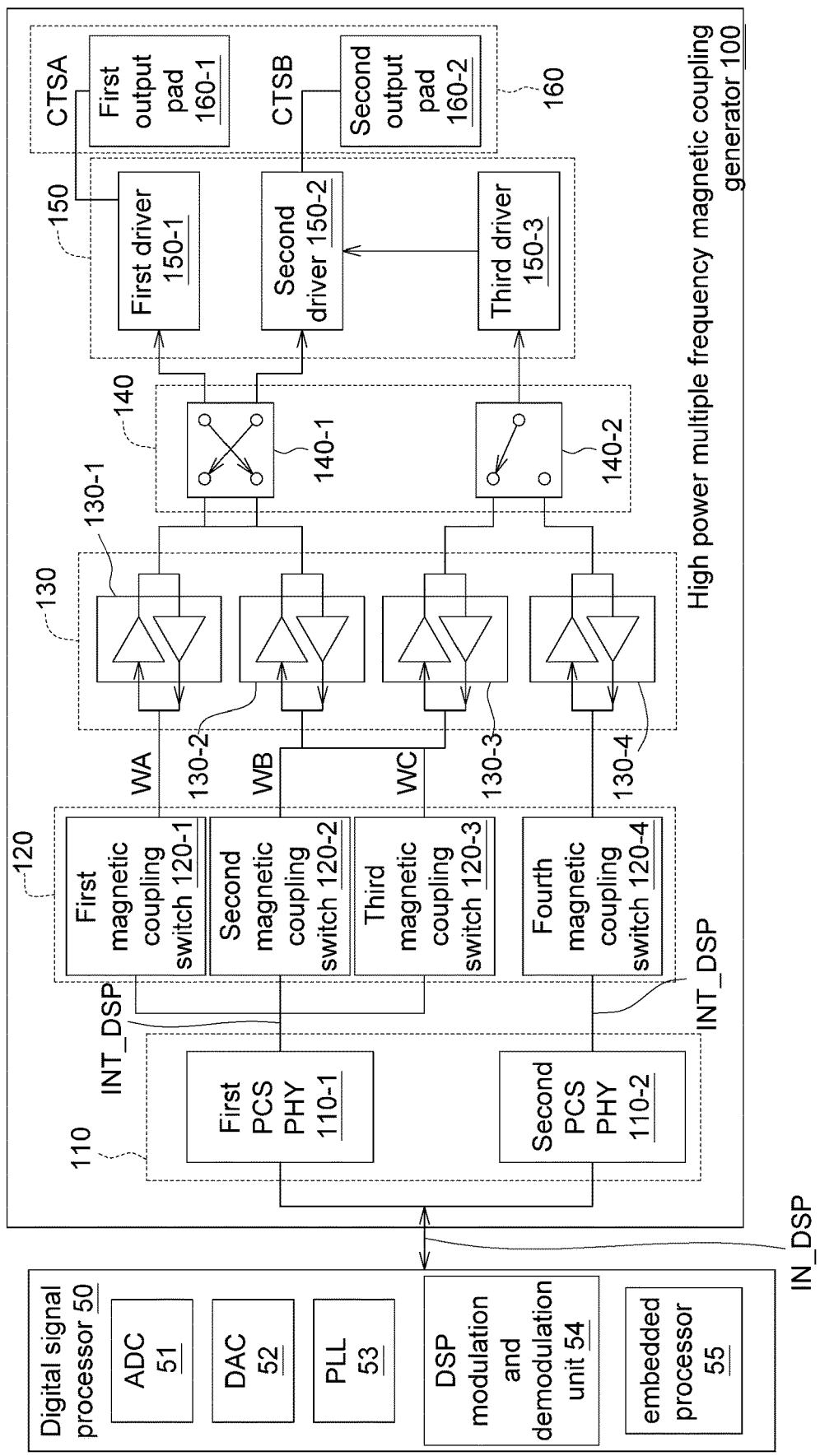
FIG. 1 is a function block diagram of a high power multiple frequency coupling generator according to an embodiment of the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Technical terms are used in the specification with reference to the prior art used in the technology field. For any terms described or defined in the specification, the descriptions and definitions in the specification shall prevail. Each embodiment of the present disclosure has one or more technical features. Given that each embodiment is implementable, a person ordinarily skilled in the art can selectively implement or combine some or all of the technical features of any embodiment of the present disclosure.

FIG. 1 is a function block diagram of a high power multiple frequency coupling generator according to an embodiment of the present disclosure. The high power multiple frequency coupling generator 100 is coupled to a digital signal processor (DSP) 50. In an illustrative rather than a restrictive sense, the digital signal processor 50 includes an analog-to-digital converter (ADC) 51, a digital-to-analog converter (DAC) 52, a digital phase locked loop (PLL) 53, a DSP modulation and demodulation unit 54 and an embedded processor 55. Signals can be transmitted between the high power multiple frequency coupling generator 100 and the digital signal processor 50.

The high power multiple frequency coupling generator 100 according to an embodiment of the present disclosure includes an interpretation channel 110, a magnetic coupling switch circuit 120, an interlocking circuit 130, a switch circuit 140, a driver circuit 150 and an output pad group 160.

The interpretation channel 110 is coupled to the digital signal processor 50 for signal transmission between the interpretation channel 110 and the digital signal processor 50. The interpretation channel 110 includes a first physical coding sub-layer (PCS) physical layer (PHY) 110-1 and a second physical coding sub-layer physical layer 110-2. When the digital signal processor 50 transmits signals to the interpretation channel 110, the digital signal processor 50 synchronically transmits signals to the first physical coding sub-layer physical layer 110-1 and the second physical coding sub-layer physical layer 110-2 of the interpretation channel 110. The first physical coding sub-layer physical layer 110-1 and the second physical coding sub-layer physical layer 110-2 interpret an input digital control signal IN_DSP transmitted from the digital signal processor 50 into an interpreted digital control signal INT_DSP. The input digital control signal IN_DSP can be realized by such as a pulse width modulation (PWM) signal, but not limited thereto. The interpreted digital control signal INT_DSP interpreted by the first physical coding sub-layer physical layer 110-1 and the second physical coding sub-layer physical layer 110-2 is transmitted to the magnetic coupling switch circuit 120.

The magnetic coupling switch circuit 120 is coupled to the interpretation channel 110. The magnetic coupling switch circuit 120 includes a first magnetic coupling switch 120-1, a second magnetic coupling switch 120-2, a third magnetic coupling switch 120-3 and a fourth magnetic coupling switch 120-4. The magnetic coupling switch circuit 120 receives the interpreted digital control signal from the interpretation channel 110. The first magnetic coupling switch 120-1, the second magnetic coupling switch 120-2, and the third magnetic coupling switch 120-3 receive the interpreted digital control signal INT_DSP from the first physical coding sub-layer physical layer 110-1. The fourth magnetic coupling switch 120-4 receives the interpreted digital control signal INT_DSP from the second physical coding sub-layer physical layer 110-2.

The first magnetic coupling switch 120-1, the second magnetic coupling switch 120-2 and the third magnetic coupling switch 120-3 form a three-phase channel, and there are time differences between signals transmitted from the three-phase channel. Ideally, for example but not limited by, the signal transmitted from the first channel (the first magnetic coupling switch 120-1) has 1 ms delay; the signal transmitted from the second channel (the second magnetic coupling switch 120-2) has 2 ms delay, the signal transmitted from the third channel (the third magnetic coupling switch 120-3) has 3 ms delay. In reality, through the interpretation made by the first magnetic coupling switch 120-1, the second magnetic coupling switch 120-2 and the third magnetic coupling switch 120-3, the time difference between the first channel and the second channel may become less than 1 ms, but the time difference between the second channel and the third channel may become greater than 2 ms. Erroneous variations of time difference may lead to erroneous operations of the backend three-phase six-arm drive circuit. Thus, an embodiment of the present disclosure corrects this erroneous variations of time difference.

In an illustrative rather than a restrictive sense, of the input digital control signals IN_DSP transmitted from the digital signal processor 50, the first item of the input digital control signals IN_DSP is transmitted to the first magnetic coupling switch 120-1; the second item of the input digital control signals IN_DSP is transmitted to the second magnetic coupling switch 120-2; and the third item of the input digital control signals IN_DSP is transmitted to the third magnetic coupling switch 120-3. By the same analogy, remaining items of the input digital control signals IN_DSP are sequentially transmitted to the three magnetic coupling switches 120-1-120-3.

Through interpretation, the first magnetic coupling switch 120-1 transmits the first magnetic coupling signal WA to the interlocking circuit 130; the second magnetic coupling switch 120-2 transmits the second magnetic coupling signal WB to the interlocking circuit 130; and, the third magnetic coupling switch 120-3 transmits the third magnetic coupling signal WC to the interlocking circuit 130. Each of the magnetic coupling signals WA-WC has a signal width parameter (including but is not limited to pulse width parameter) and a signal potential parameter (including but is not limited to pulse potential parameter).

In an embodiment of the present disclosure, in an illustrative rather than a restrictive sense, the first magnetic coupling switch 120-1, the second magnetic coupling switch 120-2, the third magnetic coupling switch 120-3 and the fourth magnetic coupling switch 120-4 can perform periodic wave decomposition, discrete time signal conversion, and correspondence calculation between time domain signal and frequency domain.

In an embodiment of the present disclosure, in an illustrative rather than a restrictive sense, the fourth magnetic coupling switch 120-4 further can selectively perform abnormality detection such as noise fast Fourier transform (FFT), internal resistance degradation, direct signal internal resistance, and single pole double throw (SPDT) look-up table.

The interlocking circuit 130 is coupled to the magnetic coupling switch circuit 120 and is interposed between the magnetic coupling switch circuit 120 and the switch circuit 140. The interlocking circuit 130 includes a first interlocking unit 130-1, a second interlocking unit 130-2, a third interlocking unit 130-3 and a fourth interlocking unit 130-4. Each of the interlocking units 130-1-130-4 includes at least two head-to-tail docking amplifiers. The output signal of the first magnetic coupling switch 120-1 is inputted to the first interlocking unit 130-1; the output signals of the second magnetic coupling switch 120-2 and the third magnetic coupling switch 120-3 are inputted to the second interlocking unit 130-2 and the third interlocking unit 130-3; and, the output signal of the fourth magnetic coupling switch 120-4 is inputted to the fourth interlocking unit 130-4.

The interlocking circuit 130 can perform phased coupling on the input and output signals of the interlocking circuit 13. Take the first interlocking unit 130-1 for example, phased coupling refers to comparison and interaction detection performed on the input and output signals of the first interlocking unit 130-1 by the first interlocking unit 130-1 using a closed-loop architecture. Thus, the first interlocking unit 130-1 can obtain the time difference and/or potential difference between the input signal and the output signal. The second interlocking unit 130-2, the third interlocking unit 130-3 and the fourth interlocking unit 130-4 also can perform operations identical or similar to that performed by the first interlocking unit 130-1.

If the output signal of the first interlocking unit 130-1 has a lower potential value, this potential can be boosted by the switch circuit 140. Similarly, if the output signal of the first interlocking unit 130-1 has a higher potential value, this potential value can be lowered by the switch circuit 140. The second interlocking unit 130-2, the third interlocking unit 130-3 and the fourth interlocking unit 130-4 also can perform operations identical or similar to that performed by the first interlocking unit 130-1. The time difference can be adjusted by the same analogy, and details are not repeated here.

The switch circuit 140 is coupled to the interlocking circuit 130 and is interposed between the interlocking circuit 130 and the driver circuit 150. The switch circuit 140 includes a first switch 140-1 and a second switch 140-2. The first switch 140-1 can be realized by a double pole double throw (DPDT) switch; the second switch 140-2 can be realized by a single pole double throw (SPDT) switch. The output signals of the first interlocking unit 130-1 and the second interlocking unit 130-2 are inputted to the first switch 140-1; the output signals of the third interlocking unit 130-3 and the fourth interlocking unit 130-4 are inputted to the second switch 140-2. The first switch 140-1 and the second switch 140-2 can switch bands. The operations of the first switch 140-1 and the second switch 140-2 are relevant to band switching, that is, the switch circuit 140 performs band switching on the output signal of the interlocking circuit 130.

The driver circuit 150 is coupled to switch circuit 140 and is interposed between the switch circuit 140 and the output pad group 160. The driver circuit 150 generates a driving signal according to an output signal of the switch circuit 140. The driver circuit 150 includes a first driver 150-1, a second driver 150-2 and a third driver 150-3. The output of the first switch 140-1 can be inputted to the first driver 150-1 or the second driver 150-2, that is, the output end of the first switch 140-1 is connected to the first driver 150-1 and the second driver 150-2 respectively. The first switch 140-1 may select and input the output of the first interlocking unit 130-1 and the second interlocking unit 130-2 to the first driver 150-1 and the second driver 150-2. That is, the input end of the first switch 140-1 is connected to the first interlocking unit 130-1 and the second interlocking unit 130-2. Similarly, the output of the second switch 140-2 can be inputted to the third driver 150-3. That is, the output end of the second switch 140-2 is connected to the third driver 150-3, and the input end of the second switch 140-2 is connected to the third interlocking unit 130-3 and the fourth interlocking unit 130-4. The second switch 140-2 may select and input the output of the third interlocking unit 130-3 and the fourth interlocking unit 130-4 to the third driver 150-3.

The output pad group 160 is coupled to the driver circuit 150. The output pad group 160 includes a first output pad 160-1 and a second output pad 160-2. The first output pad 160-1 and the second output pad 160-2 can transmit the driving signals (output signals) CTSA and CTSB generated by the driver circuit 150 to the backend three-phase six-arm drive circuit.

Figure 2A:
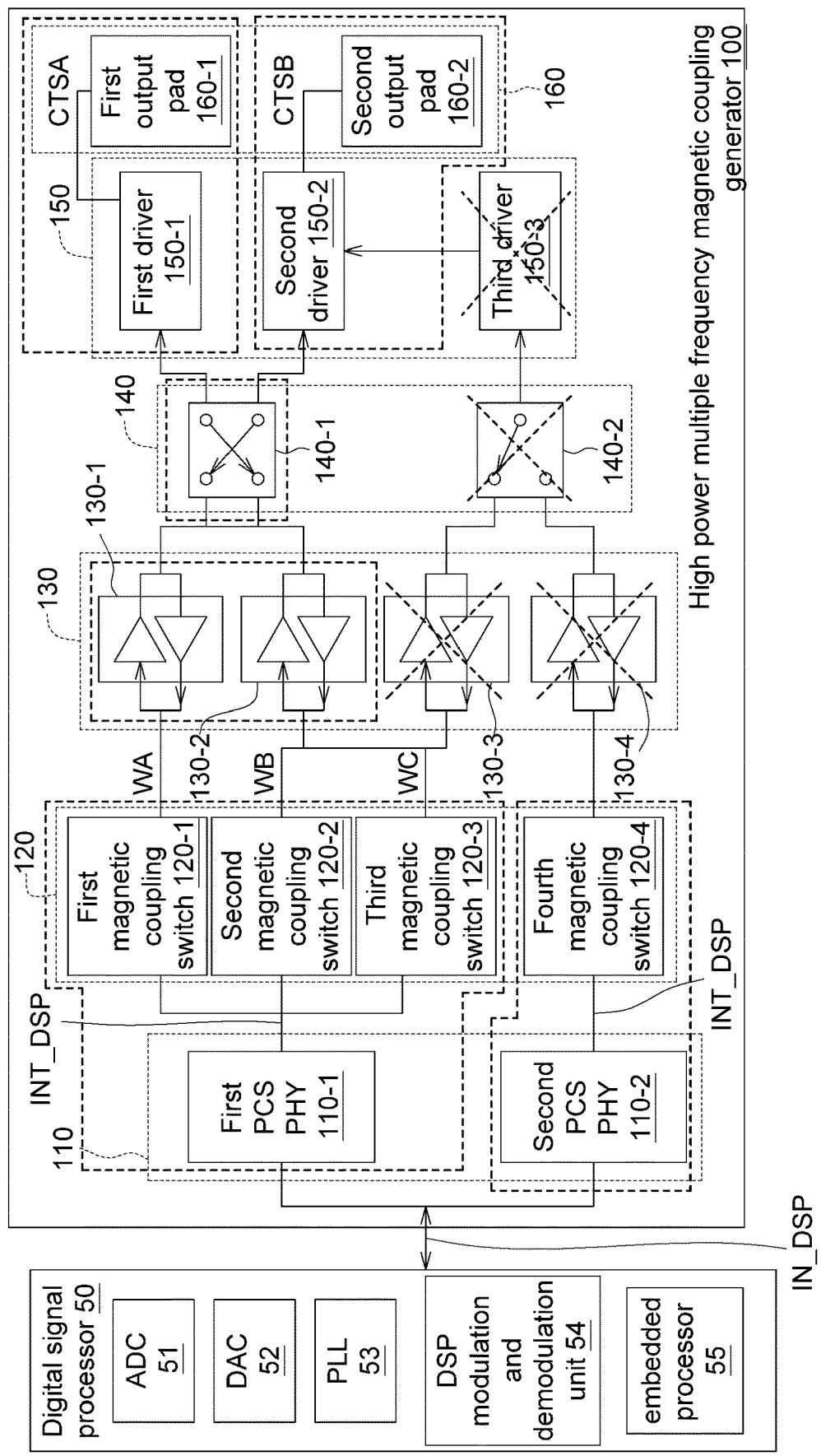
FIG. 2A is a schematic diagram of a high power multiple frequency coupling generator in normal operations according to an embodiment of the present disclosure.
Figure 2B:
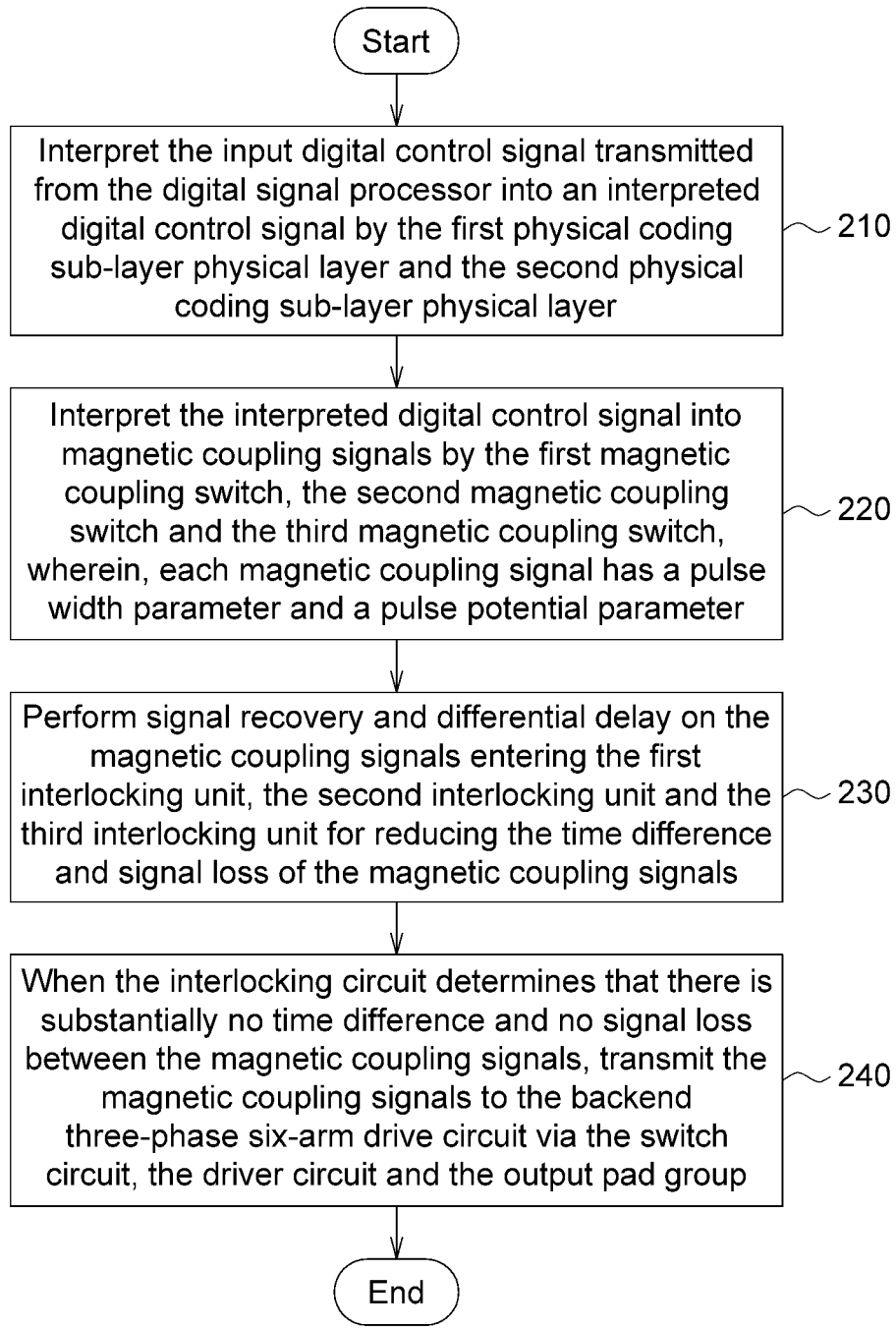
FIG. 2B is a flowchart of a high power multiple frequency coupling driving method for normal operations according to an embodiment of the present disclosure.
Figure 2C:
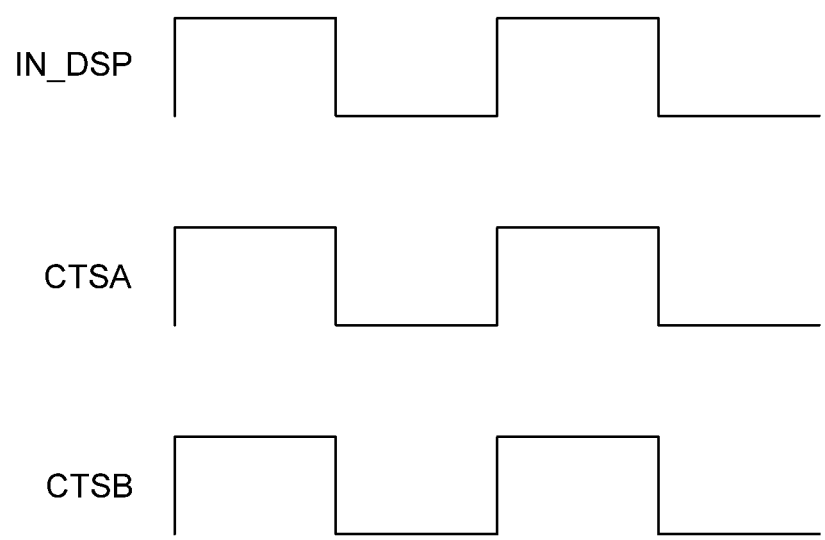
FIG. 2C is a signal diagram of a high power multiple frequency coupling generator in normal operations according to an embodiment of the present disclosure.

FIG. 2A is a schematic diagram of a high power multiple frequency coupling generator in normal operations according to an embodiment of the present disclosure. FIG. 2B is a flowchart of a high power multiple frequency coupling driving method for normal operations according to an embodiment of the present disclosure. FIG. 2C is a signal diagram of a high power multiple frequency coupling generator in normal operations according to an embodiment of the present disclosure.

In normal operations, in step 210, an input digital control signal IN_DSP transmitted from the digital signal processor 50 is interpreted into an interpreted digital control signal INT_DSP by the first physical coding sub-layer physical layer 110-1 and the second physical coding sub-layer physical layer 110-2 as indicated in FIGS. 2A and 2B.

In step 220, the interpreted digital control signal INT_DSP is interpreted into magnetic coupling signals WA-WC by the first magnetic coupling switch 120-1, the second magnetic coupling switch 120-2 and the third magnetic coupling switch 120-3 of the magnetic coupling switch circuit 120, wherein, each of the magnetic coupling signals WA-WC has a pulse width parameter and a pulse potential parameter.

In step 230, signal recovery and differential delay are performed on the magnetic coupling signals WA-WC entering the first interlocking unit 130-1, the second interlocking unit 130-2 and the third interlocking unit 130-3 of the interlocking circuit 130 for reducing the time difference and signal loss of the magnetic coupling signals WA-WC and even making the magnetic coupling signals WA-WC substantially free of time difference and signal loss. In an embodiment of the present disclosure, "signal recovery" refers to the digital signal processing which re-interprets the input signal and separates the interference source which would otherwise interfere with the input signal and cause system failure; "differential delay" refers to the digital signal processing, which executes the previous normal signal source and waits for the next interference signal to be removed when the input signal is interfered with and corresponding action still cannot be determined through interpretation.

In step 240, when the interlocking circuit 130 determines that there is no time difference and no signal loss between the magnetic coupling signals WA-WC, the magnetic coupling signals WA-WC are transmitted to the backend three-phase six-arm drive circuit via the switch circuit 140, the driver circuit 150 and the output pad group 160. Particularly, based on the properties of the first switch 140-1 (DPDT) of the switch circuit 140, the magnetic coupling signals WA and WB are transmitted to the driver circuit 150 and the output pad group 160 and further to the backend three-phase six-arm drive circuit.

In an illustrative rather than a restrictive sense, through the interpretation made by the first magnetic coupling switch 120-1 and the second magnetic coupling switch 120-2 of the magnetic coupling switch circuit 120, the magnetic coupling signal WA has 5 dB (pulse potential)/4 ms (pulse width), and the magnetic coupling signal WB has 6 dB (pulse potential)/5 ms (pulse width).

Through the interlocking operation (phased coupling) performed by the first interlocking unit 130-1 and the second interlocking unit 130-2 of the interlocking circuit 130, the interlocking circuit 130 determines that the magnetic coupling signals WA and WB are normal, and the magnetic coupling signal WA and WB enter the backend three-phase six-arm drive circuit via the switch circuit 140, the driver circuit 150 and the output pad group 160 to control the upper arm and the lower arm of the three-phase six-arm drive circuit, wherein, the upper arm and the lower arm are not allowed to be turned on at the same time.

As indicated in FIG. 2A, in normal operations, the first interlocking unit 130-1, the second interlocking unit 130-2, the first switch 140-1, the first driver 150-1 and the second driver 150-2 of the high power multiple frequency coupling generator according to an embodiment of the present disclosure are making actions; and, the third interlocking unit 130-3, the fourth interlocking unit 130-4, the second switch 140-2 and the third driver 150-3 do not have actions.

As indicated in FIG. 2C, through interpretation, the interlocking circuit 130 determines that the magnetic coupling signal WA and WB are normal, and the output signals CTSA and CTSB can control the three-phase six-arm drive circuit.

Abnormal operations of the high power multiple frequency coupling generator according to an embodiment of the present disclosure are disclosed below.

Figure 3A:
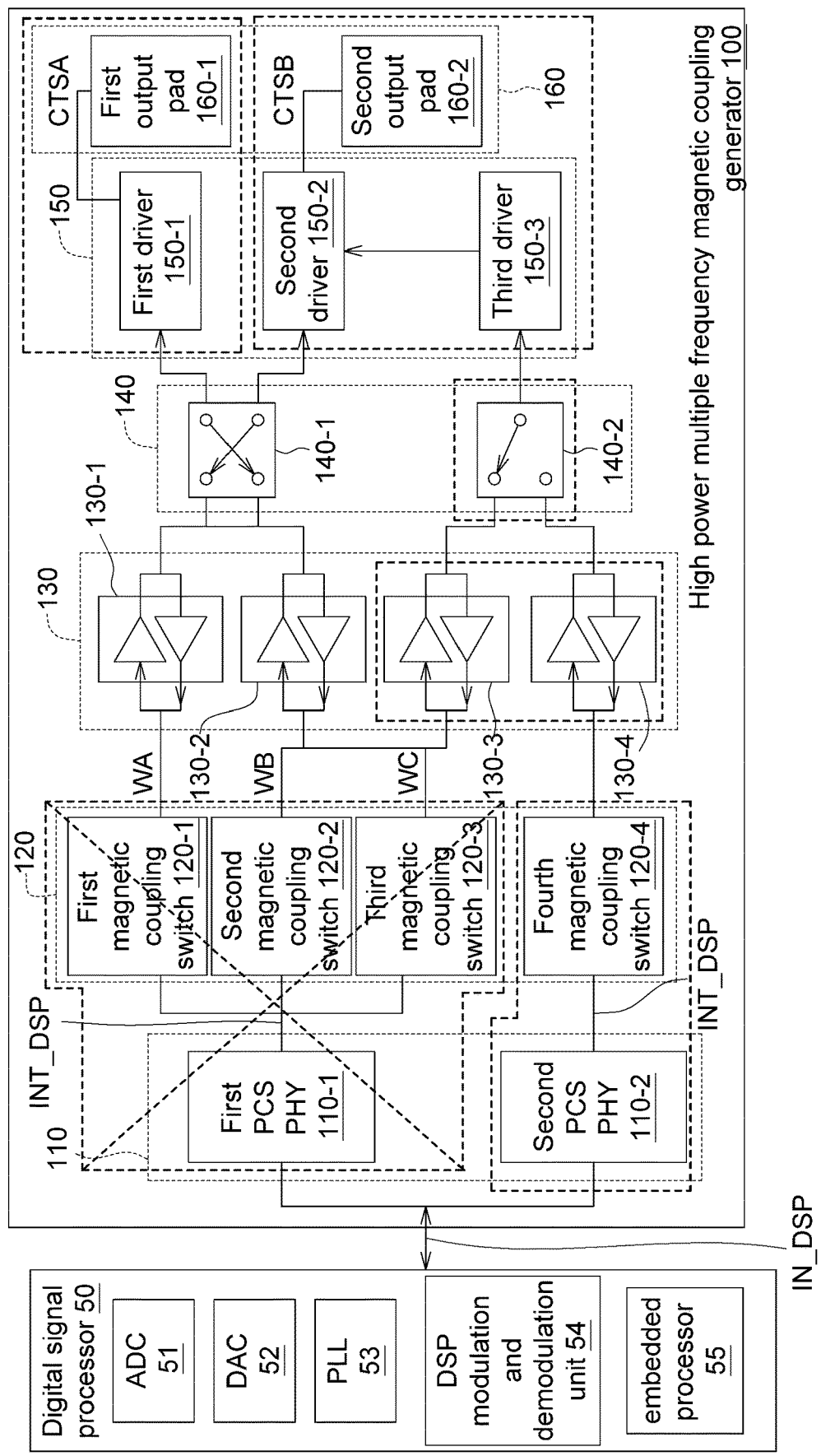
FIG. 3A is a schematic diagram of a high power multiple frequency coupling generator in abnormal operations according to an embodiment of the present disclosure.
Figure 3B:
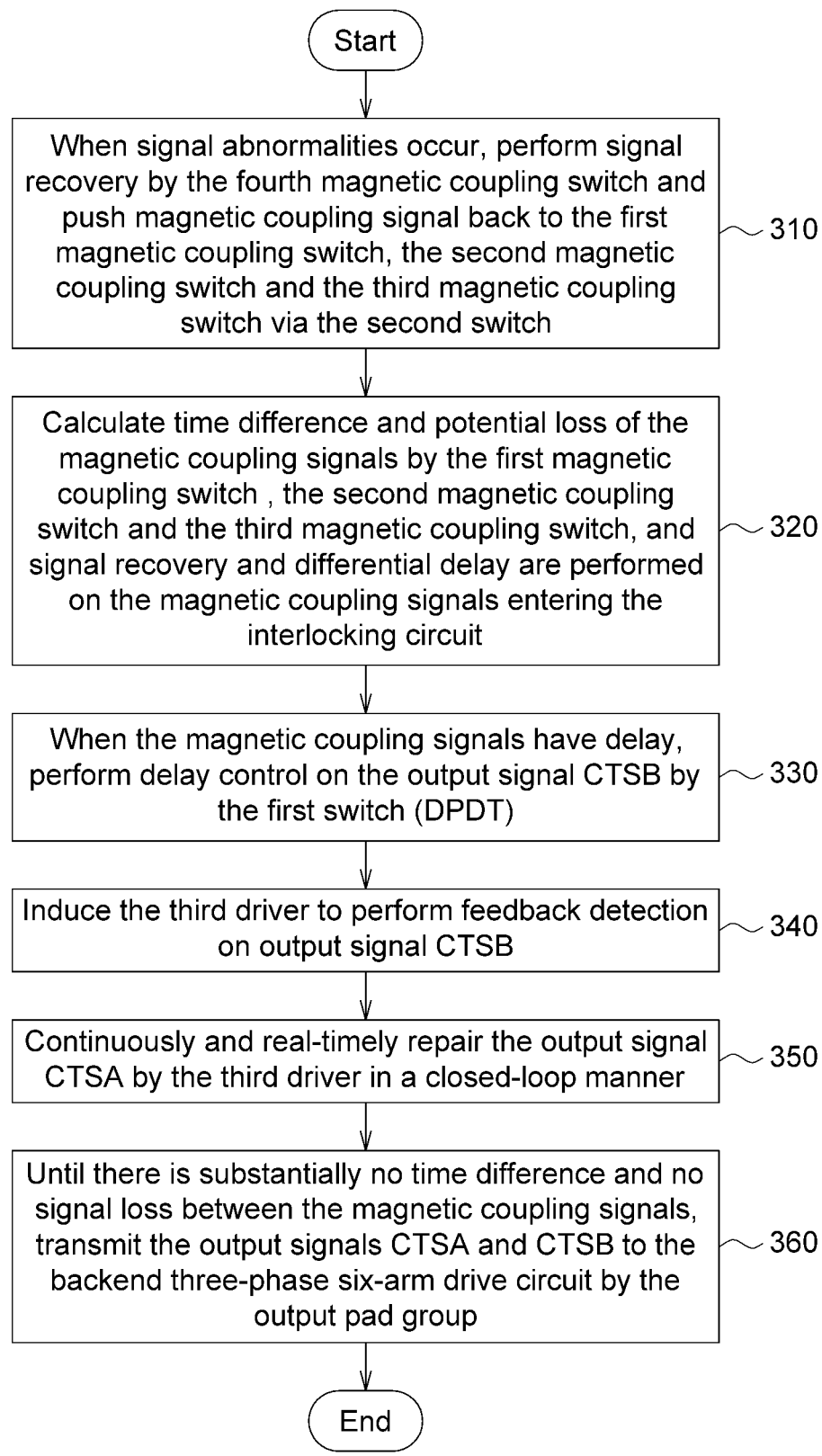
FIG. 3B is a flowchart of a high power multiple frequency coupling driving method for abnormal operations according to an embodiment of the present disclosure.
Figure 3C:
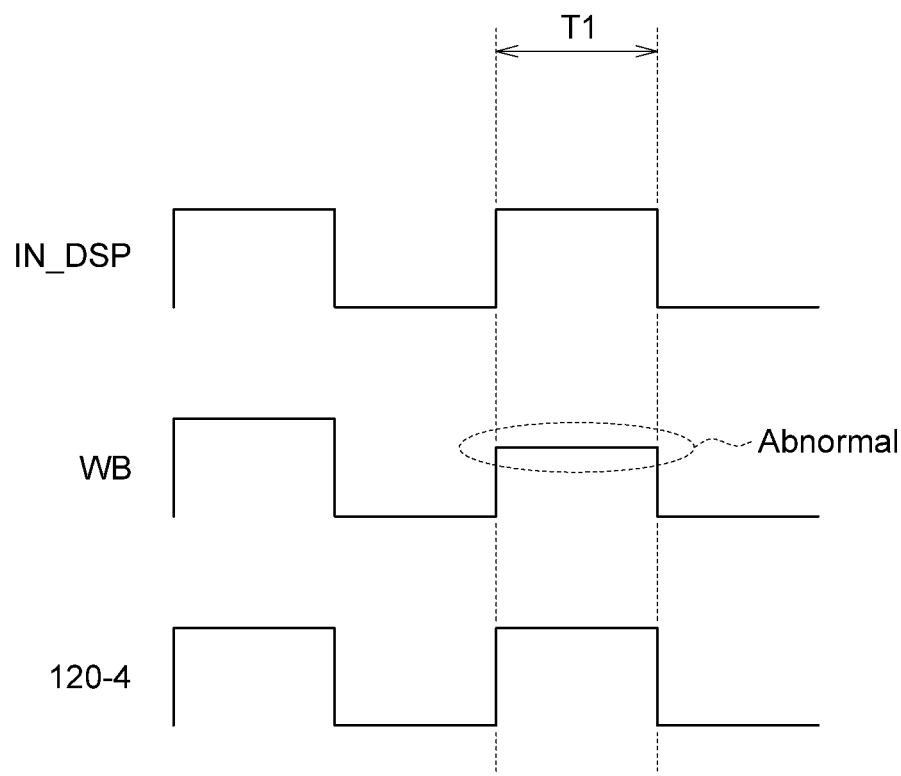
FIG. 3C is a signal diagram of a high power multiple frequency coupling generator in abnormal operations according to an embodiment of the present disclosure.

FIG. 3A is a schematic diagram of a high power multiple frequency coupling generator in abnormal operations according to an embodiment of the present disclosure. FIG. 3B is a flowchart of a high power multiple frequency coupling driving method for abnormal operations according to an embodiment of the present disclosure. FIG. 3C is a signal diagram of a high power multiple frequency coupling generator in abnormal operations according to an embodiment of the present disclosure. In an embodiment of the present disclosure, signal abnormalities may include but are not limited to time difference between the magnetic coupling signals WA-WC exceeding the threshold or the signal loss of the magnetic coupling signals WA-WC exceeding the threshold. FIG. 3C illustrates abnormal operations which arise when the signal loss of the magnetic coupling signal WB exceeds the threshold at time sequence T1 for instance. When abnormalities occur, the first physical coding sub-layer physical layer 110-1 and the first magnetic coupling switch 120-1 to the third magnetic coupling switch 120-3 will be turned off until abnormalities are excluded. Besides, when abnormalities occur, the second physical coding sub-layer physical layer 110-2, the fourth magnetic coupling switch 120-4, the interlocking circuit 130, the switch circuit 140, and the driver circuit 150 are in normal state and can exclude abnormalities.

In step 310, when signal abnormalities occur, signal recovery is performed by the fourth magnetic coupling switch 120-4, and the magnetic coupling signal is pushed back to the first magnetic coupling switch 120-1 to the third magnetic coupling switch 120-3 via the second switch 140-2 (SPDT). In the specification of the present disclosure, "pushing back" refers to the magnetic coupling signal being pushed back from the second switch 140-2 to the first magnetic coupling switch 120-1 to the third magnetic coupling switch 120-3 via the head-to-tail docking amplifiers of the interlocking units 130-1~130-4.

In step 320, time difference and potential loss of the magnetic coupling signals WA-WC are calculated by the first magnetic coupling switch 120-1 to the third magnetic coupling switch 120-3, and signal recovery and differential delay are performed on the magnetic coupling signals WA-WC entering the interlocking circuit 130.

In step 330, when the magnetic coupling signals WA-WC have delay, delay control is performed on the output signal CTSB by the first switch (DPDT) 140-1.

In step 340, the third driver 150-3 is induced to perform feedback detection on an output signal CTSB. In an illustrative rather than a restrictive sense, the fourth magnetic coupling switch 120-4 receives the interpreted digital control signal INT_DSP interpreted by the second physical coding sub-layer physical layer 110-2; the output signal of the fourth magnetic coupling switch 120-4 is inputted to the fourth interlocking unit 130-4; the output signal of the fourth interlocking unit 130-4 is inputted to the second switch 140-2; and, the output of the second switch 140-2 is inputted to the third driver 150-3. Here, the three-phase channel at the top does not have actions.

In step 350, the output signal CTSA is continuously and real-timely repaired by the third driver 150-3 in a closed-loop manner.

In step 360, until normal operations are recovered (in an illustrative rather than a restrictive sense, the magnetic coupling signals WA-WC have substantially no potential loss and no time difference), the output signals CTSA and CTSB are transmitted to the backend three-phase six-arm drive circuit by the output pad group 160.

In an illustrative rather than a restrictive sense, through the interpretation made by the first magnetic coupling switch 120-1 and the second magnetic coupling switch 120-2 of the magnetic coupling switch circuit 120, the magnetic coupling signal WA has 5 dB (pulse potential)/5 ms (pulse width), and magnetic coupling signal WB has 5 dB (pulse potential)/4 ms (pulse width) (this abnormality is not illustrated in FIG. 3C). In such case, the upper and lower arms of the backend three-phase six-arm drive circuit will be turned on at the same time, making the backend three-phase six-arm drive circuit burned down.

Therefore, the above operations are compensated through the process of FIG. 3B, the magnetic coupling signal WB is compensated to 5 dB (pulse potential)/6 ms (pulse width), so that the upper and lower arms of the backend three-phase six-arm drive circuit cannot be turned on at the same time.

In an embodiment of the present disclosure, a smart high power multiple frequency coupling generator and a driving method thereof are provided. The smart high power multiple frequency coupling generator and the driving method thereof can dynamically and real-timely adjust phased coupling and operate frequency band.

In an embodiment of the present disclosure, a smart high power multiple frequency coupling generator and a driving method thereof are provided. With a new type of architectural interface, a set of transmission interfaces for integrating multiple frequency control system is designed. Through a detection mechanism of hardware loop, the potential value of current output signal can be analyzed for the digital signal processor to perform real-time analysis and judgment.

In an embodiment of the present disclosure, a smart high power multiple frequency coupling generator and a driving method are provided. With a smart adjustment mechanism, the driver is not subjected to magnetic interference when sending instructions or transmitting information.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:
1. A multiple frequency coupling generator coupled to a digital signal processor, the multiple frequency coupling generator comprising:
   an interpretation channel coupled to the digital signal processor for signal transmission between the interpretation channel and the digital signal processor, wherein the interpretation channel interprets an input digital control signal transmitted from the digital signal processor into an interpreted digital control signal;

a magnetic coupling switch circuit coupled to the interpretation channel to receive the interpreted digital control signal from the interpretation channel, wherein the magnetic coupling switch circuit comprises a three-phase channel, and, through interpretation, the magnetic coupling switch circuit generates a plurality of magnetic coupling signals each having a signal width parameter and a signal potential parameter;

an interlocking circuit coupled to the switch circuit to receive the magnetic coupling signals, wherein the interlocking circuit performs phased coupling on the magnetic coupling signals and an output signal of the interlocking circuit;

a switch circuit coupled to the interlocking circuit to receive the output signal of the interlocking circuit, wherein the switch circuit performs band switching on the output signal of the interlocking circuit to generate an output signal;

a driver circuit coupled to the switch circuit to generate a first driving signal and a second driving signal according to the output signal of the switch circuit; and an output pad group coupled to the driver circuit to transmit the first and the second driving signals of the driver circuit to a backend driving loop.

2. The multiple frequency coupling generator according to claim 1, wherein, the interpretation channel comprises: a first physical coding sub-layer physical layer and a second physical coding sub-layer physical layer, wherein the digital signal processor synchronically inputs the input digital control signal to the first and the second physical coding sub-layer physical layers, and the first and the second physical coding sub-layer physical layers interpret the input digital control signal into the interpreted digital control signal; and the input digital control signal is a pulse width modulation (PWM) signal.

3. The multiple frequency coupling generator according to claim 2, wherein, the magnetic coupling switch circuit comprises: a first to a fourth magnetic coupling switch, the first magnetic coupling switch, the second magnetic coupling switch and the third magnetic coupling switch form the three-phase channel, the input digital control signal transmitted from the digital signal processor is sequentially transmitted to the three-phase channel, the three-phase channel transmits the magnetic coupling signals to the interlocking circuit, the fourth magnetic coupling switch is coupled to the second physical coding sub-layer physical layer to receive the interpreted digital control signal from the second physical coding sub-layer physical layer, and each of the magnetic coupling signals has a pulse width parameter and a pulse potential parameter.

4. The multiple frequency coupling generator according to claim 3, wherein, the interlocking circuit comprises: a first interlocking unit to a fourth interlocking unit configured to receive the magnetic coupling signals from the magnetic coupling switches, the first interlocking unit to the third interlocking unit perform comparison and interaction detection on the magnetic coupling signals and the output signal of the interlocking circuit using a closed-loop architecture to detect a potential difference and/or a time difference between the magnetic coupling signals and the output signal of the interlocking circuit to adjust the potential difference and/or the time difference by the switch circuit; the fourth interlocking unit is coupled to the fourth magnetic coupling switch, and each of the interlocking units has at least two head-to-tail docking amplifiers.

5. The multiple frequency coupling generator according to claim 4, wherein, the switch circuit comprises: a first switch and a second switch, wherein respective output signals of the first interlocking unit and the second interlocking unit are inputted to the first switch, and respective output signals of the third interlocking unit and the fourth interlocking unit are inputted to the second switch.

6. The multiple frequency coupling generator according to claim 5, wherein, the first switch is a double pole double throw (DPDT) switch, and the second switch is a single pole double throw (SPDT) switch.

7. The multiple frequency coupling generator according to claim 5, wherein, the driver circuit comprises: a first driver, a second driver and a third driver, an output of the first switch is inputted to the first driver or the second driver, the first switch selects and inputs the output signals of the first interlocking unit and the second interlocking unit to the first driver and the second driver, an output of the second switch is inputted to the third driver, and the second switch selects and inputs the output signals of the third interlocking unit and the fourth interlocking unit to the third driver.

8. The multiple frequency coupling generator according to claim 7, wherein, the output pad group comprises: a first output pad and a second output pad configured to transmit the first and the second driving signals of the driver circuit to the backend driving loop, and the backend driving loop is a backend three-phase six-arm drive circuit.

9. The multiple frequency coupling generator according to claim 8, wherein, in normal operations, the input digital control signal transmitted from the digital signal processor is interpreted into the interpreted digital control signal by the first physical coding sub-layer physical layer and the second physical coding sub-layer physical layer;

the interpreted digital control signal is interpreted into the magnetic coupling signals by the first magnetic coupling switch, the second magnetic coupling switch and the third magnetic coupling switch of the magnetic coupling switch circuit;

the first interlocking unit, the second interlocking unit and the third interlocking unit of the interlocking circuit perform signal recovery and differential delay on the magnetic coupling signals for reducing time difference and signal loss of the magnetic coupling signals; and when the interlocking circuit determines that the magnetic coupling signals have substantially no time difference and no signal loss, the magnetic coupling signals are transmitted to the backend driving loop by the switch circuit, the driver circuit and the output pad group.

10. The multiple frequency coupling generator according to claim 9, wherein, in abnormal operations, the fourth magnetic coupling switch performs signal recovery, and the magnetic coupling signals are pushed back to the first magnetic coupling switch, the second magnetic coupling switch and the third magnetic coupling switch by the second switch;

the first magnetic coupling switch to the third magnetic coupling switch calculate the time difference and the loss of the magnetic coupling signals, and the interlocking circuit performs phased coupling to perform signal recovery and differential delay;

when the magnetic coupling signals have delay, the first switch performs delay control on the second driving signal;

the third driver is induced to perform feedback detection on the second driving signal;

the third driver real-timely repairs the first driving signal in a closed-loop manner; and until the magnetic coupling signals have substantially no loss and no time difference, the output pad group transmits the first driving signal and the second driving signal to the backend driving loop.

11. A driving method for a multiple frequency coupling generator for driving the multiple frequency coupling generator according to claim 1, the driving method comprises:

in normal operations, interpreting the input digital control signal transmitted from the digital signal processor into the interpreted digital control signal;

interpreting the interpreted digital control signal into a plurality of magnetic coupling signals by the magnetic coupling switch circuit;

performing signal recovery and differential delay on the magnetic coupling signals by the interlocking circuit for reducing time difference and signal loss of the magnetic coupling signals; and when the interlocking circuit determines that the magnetic coupling signals have substantially no time difference and no signal loss, transforming the magnetic coupling signals into the first driving signal and the second driving signal by the switch circuit, the driver circuit and the output pad group to drive the backend driving loop.

12. The driving method for the multiple frequency coupling generator according to claim 11, wherein, the magnetic coupling switch circuit comprises a first to a fourth magnetic coupling switch, and the driving method further comprises:

in abnormal operations, performing signal recovery by the fourth magnetic coupling switch and pushing the magnetic coupling signals back to the first magnetic coupling switch, the second magnetic coupling switch and the third magnetic coupling switch via the second switch;

calculating the time difference and the loss of the magnetic coupling signals by the first magnetic coupling switch, the second magnetic coupling switch and the third magnetic coupling switch, and performing phased coupling by the interlocking circuit to perform signal recovery and differential delay;

when the magnetic coupling signals have delay, performing delay control on the second driving signal by a first switch of the switch circuit;

inducing a third driver of the driver circuit to perform feedback detection on the second driving signal, wherein, the fourth magnetic coupling switch receives the interpreted digital control signal from the interpretation channel; an output signal of the fourth magnetic coupling switch is inputted to a fourth interlocking unit of the interlocking circuit; an output signal of the fourth interlocking unit is input to a second switch of the switch circuit; and, an output signal of the second switch is inputted to a third driver of the driver circuit, wherein, in abnormal operations, the three-phase channel does not have actions;

real-timely repairing the first driving signal by the third driver in a closed-loop manner; and until the magnetic coupling signals have substantially no loss and no time difference, transmitting the first and the second driving signals to the backend driving loop by an output pad group.

* * * * *